US010345421B2

(12) United States Patent
Leibfritz (10) Patent No.: US 10,345,421 B2
(45) Date of Patent: Jul. 9, 2019

(54) MEASUREMENT ACCESSORY DEVICE (71) Applicant: Rohde & Schwarz GmbH & Co. KG, München (DE)

(72) Inventor: Martin Leibfritz, Aying (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 87 days.

(21) Appl. No.: 15/445,705

(22) Filed: Feb. 28, 2017

(65) Prior Publication Data
US 2017/0315206 A1 Nov. 2, 2017

(30) Foreign Application Priority Data

May 2, 2016 (EP) ..................................... 16167981

(51) Int. Cl.
G01R 35/00 (2006.01)
G06K 7/14 (2006.01)
G06K 19/06 (2006.01)
G01R 27/28 (2006.01)
G06F 3/044 (2006.01)
G01R 31/319 (2006.01)
G01R 13/02 (2006.01)
G01R 27/04 (2006.01)
G01R 27/32 (2006.01)

(52) U.S. Cl.
CPC ........... *G01R 35/005* (2013.01); *G01R 13/02* (2013.01); *G01R 27/04* (2013.01); *G01R 27/28* (2013.01); *G01R 27/32* (2013.01); *G01R 31/3191* (2013.01); *G01R 35/007* (2013.01); *G06K 7/1404* (2013.01); *G06K 19/06009* (2013.01); *G06F 3/044* (2013.01)

(58) Field of Classification Search
CPC ....... G01R 27/28; G01R 35/005; G06F 3/044; G06K 19/06009; G06K 7/1404
See application file for complete search history.

(56) References Cited

U.S. PATENT DOCUMENTS

| 6,232,764 B1 | 5/2001 | Rettig et al. |
| 6,995,571 B1 | 2/2006 | Liu et al. |
| 7,532,492 B2 * | 5/2009 | Dobyns ............. G01R 1/06788 324/426 |
| 8,203,348 B1 | 6/2012 | Tsironis |

(Continued)

FOREIGN PATENT DOCUMENTS

| DE | 10 2004 047 308 A1 | 3/2006 |
| DE | 10 2012 207 021 A1 | 10/2013 |

(Continued)

OTHER PUBLICATIONS

Extended European Search Report for European Application No. 16167981.6 (dated Oct. 27, 2016).

(Continued)

*Primary Examiner* — Manuel A Rivera Vargas
*Assistant Examiner* — Yaritza H Perez Bermudez
(74) *Attorney, Agent, or Firm* — Shumaker & Sieffert, P.A.

(57) ABSTRACT

A measurement accessory device connectable to a measurement apparatus or to a device under test wherein the measurement accessory device comprises means for providing characteristic data of said measurement accessory device in machine readable form used by said measurement apparatus during measurement of said device under test.

16 Claims, 5 Drawing Sheets

(56) References Cited

U.S. PATENT DOCUMENTS

| | | | |
|---|---|---|---|
| 9,140,723 B2 * | 9/2015 | Booman | G01R 1/06766 |
| 2004/0199350 A1 | 10/2004 | Blackham et al. | |
| 2005/0220675 A1 * | 10/2005 | Reed | B01L 3/5025 |
| | | | 422/400 |
| 2005/0232822 A1 * | 10/2005 | Reed | B01L 3/5025 |
| | | | 422/552 |
| 2009/0237364 A1 * | 9/2009 | Bloomcamp | G06F 3/016 |
| | | | 345/173 |
| 2009/0322347 A1 * | 12/2009 | Hashimshony | G01R 27/32 |
| | | | 324/601 |
| 2011/0213700 A1 * | 9/2011 | Sant'Anselmo | G06Q 10/10 |
| | | | 705/39 |
| 2011/0234498 A1 * | 9/2011 | Gray | G06F 3/016 |
| | | | 345/168 |
| 2012/0035904 A1 * | 2/2012 | Seckendorf | B21D 5/00 |
| | | | 703/21 |
| 2012/0112985 A1 * | 5/2012 | Franz | G01R 27/28 |
| | | | 345/1.3 |
| 2012/0319956 A1 * | 12/2012 | Talach | G06F 21/36 |
| | | | 345/168 |
| 2014/0320436 A1 * | 10/2014 | Modarres | G06F 3/0412 |
| | | | 345/173 |
| 2014/0339296 A1 * | 11/2014 | McAdams | G06F 17/30879 |
| | | | 235/375 |
| 2014/0374484 A1 * | 12/2014 | Hong | G06K 7/10732 |
| | | | 235/462.06 |
| 2015/0338982 A1 * | 11/2015 | Dufva | G06F 3/023 |
| | | | 345/168 |
| 2015/0346177 A1 * | 12/2015 | Vardi | G01N 33/18 |
| | | | 422/424 |
| 2015/0356805 A1 * | 12/2015 | Whiteman | G06K 7/0004 |
| | | | 382/135 |
| 2015/0358929 A1 | 12/2015 | Williams et al. | |
| 2016/0043778 A1 | 2/2016 | Sikina et al. | |
| 2016/0095171 A1 * | 3/2016 | Chaimov | H05B 6/6447 |
| | | | 219/704 |
| 2016/0315295 A1 * | 10/2016 | Burri | H01M 2/0222 |

FOREIGN PATENT DOCUMENTS

| | | |
|---|---|---|
| EP | 1 359 425 A2 | 11/2003 |
| EP | 2 363 719 A1 | 9/2011 |
| EP | 2 887 089 A1 | 6/2015 |
| WO | WO 2012/045844 A1 | 4/2012 |

OTHER PUBLICATIONS

McDermott et al., "A Low-Cost 100 MHz Vector Network Analyzer with USB Interface," QEX, pp. 1-12 (Jul./Aug. 2004).

Response to Communication dated Nov. 13, 2017, from counterpart European Application No. 16167981.6, filed on Mar. 27, 2018, 13 pp.

* cited by examiner

MEASUREMENT ACCESSORY DEVICE

PRIORITY CLAIM

This application claims the benefit of European Patent Application No. 16167981.6, filed May 2, 2016; the disclosure of which is incorporated herein by reference in its entirety.

FIELD OF THE INVENTION

The present patent application relates to a measurement accessory device connectable to a measurement apparatus or to a device under test. The present patent application further relates to a measurement apparatus and a test arrangement.

TECHNICAL BACKGROUND

Measurement devices—also denoted as measuring instruments or measuring apparatus—can be used to measure physical parameters or signals. Measurement devices include a variety of different types of measurement devices such as oscilloscopes, signal analyzers, network analyzers or testing devices. Measurement devices can be used in production facilities for providing services, in particular repair and maintenance services. Further, measurement devices are used in research or investigating devices under test. Measurement devices require calibration and/or recalibration of components.

Vector network analyzers VNA are designed to accurately characterize the linear behaviour of a device under test, DUT, by evaluating the phase and magnitude of incident and reflected signal waves. By measuring a phase and magnitude of these waves it is possible to determine a wide range of device characteristics comprising impedance, return loss, insertion loss and even group delay. The accuracy with which a vector network analyzer can determine a linear behaviour of a device under test is fundamentally determined by the accuracy with which the vector network analyzer can measure the phase and magnitude relationship of incident and reflected waves.

Although it is possible to calibrate certain elements of the vector network analyzer at manufacturing time such as source power and receiver accuracy, much of the calibration information required to perform an accurate measurement depends on the measurement setup or test arrangement.

Figure 1:
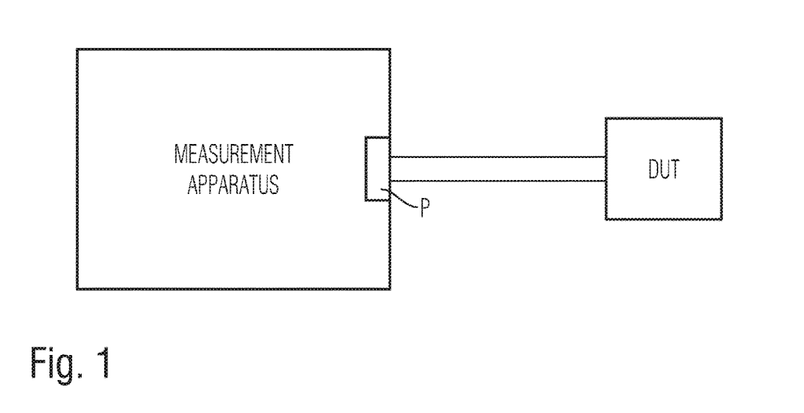
FIG. 1 illustrates a conventional test setup for testing a device under test for illustrating a problem underlying the present invention.

FIG. 1 illustrates a test arrangement where a device under test DUT is connected to a test port P of a measurement apparatus such as a vector network analyzer VNA.

In the test arrangement as illustrated in FIG. 1, it is well-known that the open circuit has an infinite impedance and that the reflected wave does have the same magnitude as the incident wave and is in-phase with the incident wave. However, the length of the cable between the vector network analyzer port P and the open circuit does affect the phase as measured by the vector network analyzer VNA. Although calibration can be useful to verify the accuracy of certain elements of a vector network analyzer such as the power of the stimulus and the frequency response of the receivers, other characteristics related to the measurement setup, such as cable length, are impossible to account for during calibration. As a result, a user calibration is necessary that not only accounts for variables due to measurement configuration but which can also account for instrument variations, for instance with respect to temperature and frequency changes.

Systematic sources of error can comprise port match, directivity, frequency, response and isolation. These errors are systematic sources of error because they systematically affect the measurement at all times. The impact of systematic errors on a measurement result can largely be removed through calibration.

When calibrating a measurement apparatus such as a vector network analyzer VNA, engineers can utilize calibration and verification tools. A calibration kit can comprise different calibration components. A manufacturer of a measurement apparatus can provide a range of calibration kits for various connector types and for both manual and automatic calibration. Calibration kits comprise calibration elements or calibration components. These calibration components can comprise calibration standards that have been carefully characterized based on the mechanical dimensions or based on measurements using a so-called golden network analyzer that has been calibrated using traceable calibration standards.

A calibration kit also contains precise information about the behaviour of each calibration component and the measurement apparatus can use this information as part of the calibration routine.

Figure 2:
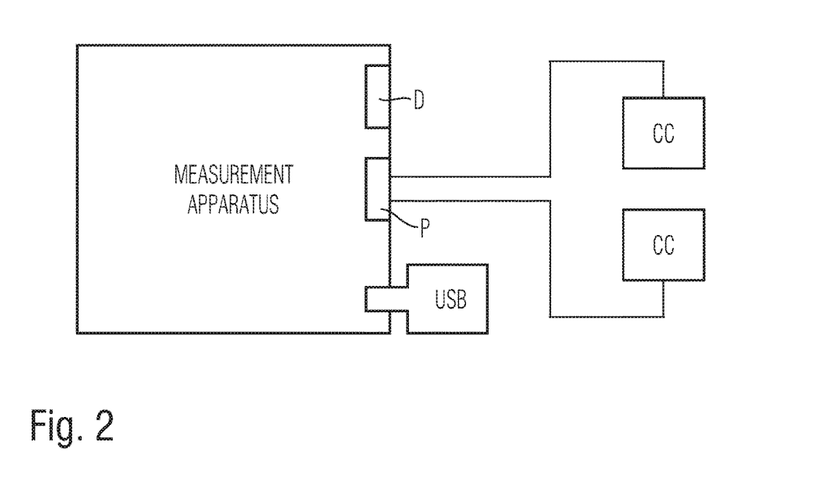
FIG. 2 illustrates a conventional calibration setup for illustrating a problem underlying the present invention.

FIG. 2 illustrates a conventional measurement apparatus such as a vector network analyzer VNA having a test port P to which two calibration components CC are connected during a calibration process. The calibration components or calibration standards used for calibration can be for instance an OPEN calibration standard, a SHORT calibration standard, a THROUGH calibration standard or a REFLECT calibration standard. To use a calibration standard or a calibration component for a VNA it is necessary that the VNA is informed about the characteristics of the respective calibration standard element. This data can comprise for instance coefficients for modelling effects of the capacity or geometric parameters such as cable length or S-parameter data. In a conventional VNA, the VNA has access to the characteristic data of the calibration standard components by means of a data carrier, a data sheet or the characteristic data is defined in a firmware of the measurement apparatus. FIG. 2 illustrates a memory stick such as an USB stick which is inserted into a data interface of the measurement apparatus. In the illustrated example, the memory stick USB stores the characteristic data of the calibration standard components CC used for the calibration of the measurement apparatus. However, this conventional way of providing the characteristic data of a measurement accessory device such as a calibration standard component has several disadvantages. It can happen that a user or engineer performing the calibration uses the wrong memory stick carrying calibration data of other calibration standard components not used in the calibration setup. Further, it can happen that a data carrier such as a memory stick storing the characteristic data of a measurement accessory device cannot be found and has to be searched for or gets completely lost. In a conventional calibration set-up as illustrated in FIG. 2, there is no security check whether the measurement apparatus uses the correct characteristic data for the respective calibration standard components. A not-experienced user or engineer may not recognize that the characteristic data does not match the used calibration standard components which leads to erroneous measurement results when measuring a device under test DUT by the measurement apparatus.

Accordingly, there is the need to overcome the above-mentioned disadvantages and to facilitate a calibration and/or measurement process.

SUMMARY OF THE INVENTION

The invention provides according to a first aspect of the present invention a measurement accessory device connectable to a measurement apparatus or connectable to a device under test, wherein the measurement accessory device comprises means for providing characteristic data of said measurement accessory device in machine readable form used by said measurement apparatus during measurement of said device under test.

In a possible embodiment of the measurement accessory device according to the first aspect of the present invention, the measurement accessory device comprises a housing adapted to carry encoded characteristic data of said measurement accessory device.

In a further possible embodiment of the measurement accessory device according to the first aspect of the present invention, the housing of said measurement accessory device comprises at least one coding surface having a structured pattern consisting of protrusions and/or recesses providing the encoded characteristic data of said measurement accessory device.

In a still further possible embodiment of the measurement accessory device according to the first aspect of the present invention, the characteristic data encoded by said coding surface of said measurement accessory device is readable by a capacitive touchscreen of said measurement apparatus when pressed against the touchscreen of said measurement apparatus.

In a still further possible embodiment of the measurement accessory device according to the first aspect of the present invention, the coding surface of said measurement accessory device comprises braille characters comprising raised dots representing the characteristic data of said measurement accessory device.

In a still further possible embodiment of the measurement accessory device according to the first aspect of the present invention, the coding surface comprises an acoustic bar code.

In a further possible embodiment of the measurement accessory device according to the first aspect of the present invention, the coding surface comprises an engraved data matrix code.

In a further possible embodiment of the measurement accessory device according to the first aspect of the present invention, the measurement accessory device comprises a calibration component or a calibration module used to calibrate the measurement apparatus.

In a further possible embodiment of the measurement accessory device according to the first aspect of the present invention, the characteristic data of said calibration component comprises type data, a calibration standard serial number, a calibration standard gender, an identification number of the calibration component and/or information data about the calibration component behaviour.

In a further possible embodiment of the measurement accessory device according to the first aspect of the present invention, the measurement accessory device comprises a test component used in a test setup to perform measurements of the device under test.

In a further possible embodiment of the measurement accessory device according to the first aspect of the present invention, the test component comprises an adapter, a cable, a probe, an attenuator, a frequency converter, an impedance converter and/or a noise signal source.

In a further possible embodiment of the measurement accessory device according to the first aspect of the present invention, characteristic data of said measurement accessory device is stored in a data memory of said measurement apparatus for further processing by a processing unit of said measurement apparatus.

The invention provides according to a second aspect a measurement apparatus comprising an input unit adapted to input characteristic data of at least one measurement accessory device according to the first aspect of the present invention and a processing unit adapted to process the input characteristic data of said measurement accessory device.

In a possible embodiment of the measurement apparatus according to the second aspect of the present invention, the input unit of the measurement apparatus is a sensor adapted to read the characteristic data from a structured surface pattern of the measurement accessory device.

In a possible embodiment of the measurement apparatus according to the second aspect of the present invention, the sensor is a capacitive touchscreen of said measurement apparatus.

In a further possible embodiment of the measurement apparatus according to the second aspect of the present invention, the sensor of the measurement apparatus comprises an acoustic sensor adapted to receive characteristic data from an acoustic bar code carried by the measurement accessory device.

In a still further possible embodiment of the measurement apparatus according to the second aspect of the present invention, the sensor of the measurement apparatus is an optical sensor adapted to sense characteristic data engraved in a structured surface pattern of the measurement accessory device.

In a still further possible embodiment of the measurement apparatus according to the second aspect of the present invention, the processing unit of the measurement apparatus is adapted to process characteristic data of different measurement accessory devices used in a test setup and/or during calibration of said measurement apparatus to check automatically whether the different measurement accessory devices are compatible to each other and/or suited to achieve a test objective of the test setup.

In a still further possible embodiment of the measurement apparatus according to the second aspect of the present invention, the measurement apparatus is a vector network analyzer comprising at least one test port for connecting a device under test to said vector network analyzer in a test setup.

The invention provides according to a third aspect a test arrangement comprising at least one measurement apparatus according to the second aspect of the present invention and one or several measurement accessory devices according to the first aspect of the present invention.

In the following, possible embodiments of the different aspects of the present invention are described in more detail with reference to the enclosed figures.

CONTENTS OF THE DRAWINGS

The present invention is described in greater detail in the following on the basis of the embodiments shown in the schematic figures of the drawings, in which.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DESCRIPTION OF EMBODIMENTS

Figure 3:
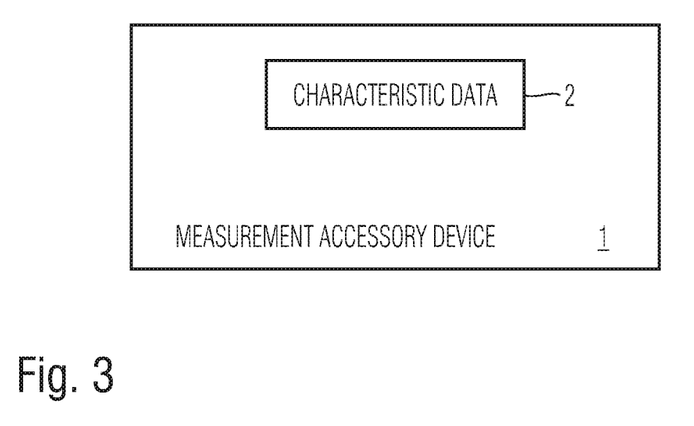
FIG. 3 shows schematically a possible exemplary embodiment of a measurement accessory device according to the first aspect of the present invention.

As shown in the schematic diagram of FIG. 3, a measurement accessory device 1 according to the first aspect of the present invention comprises in the illustrated embodiment means 2 for providing characteristic data of said measurement accessory device 1 in machine readable form to a measurement apparatus 3 which is adapted to use the characteristic data during measurement of a device under test DUT. The measurement accessory device 1 as shown in FIG. 3 can be connectable to a measurement apparatus or to a device under test. In a possible embodiment, the measurement accessory device 1 comprises a housing adapted to carry characteristic data of the measurement accessory device 1.

The measurement accessory device 1 as shown in FIG. 3 can be in a possible embodiment a calibration component or a calibration standard or a calibration module used to calibrate a measurement apparatus such as a vector network analyzer, VNA. The measurement accessory device 1 as shown in FIG. 3 can be in a further exemplary embodiment formed by a test component used in a test setup to perform measurements of a device under test DUT. The measurement accessory device 1 can for instance be formed by an adapter, a cable, a probe, an attenuator, a frequency converter, an impedance converter and/or by a signal source or signal generator.

Figure 4:
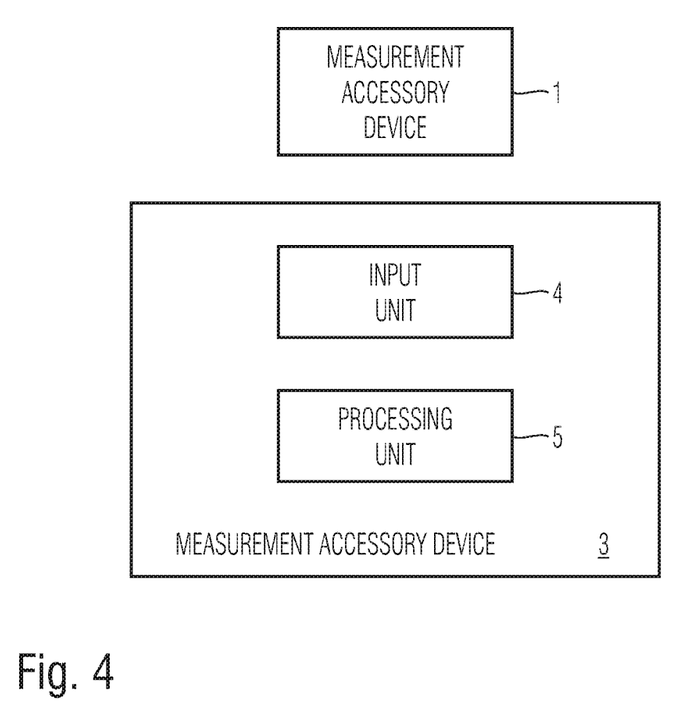
FIG. 4 shows a block diagram for illustrating a possible exemplary embodiment of a measurement apparatus according to a further aspect of the present invention.

The measurement accessory device 1 can also be a calibration component used during calibration of a measurement apparatus, for instance calibration of a measurement apparatus as illustrated in FIG. 4. The measurement accessory device 1 as shown in FIG. 3 can be in a possible implementation an OPEN calibration standard component, a SHORT calibration standard component, a THROUGH calibration standard component or a REFLECT calibration standard component. These calibration standard components can form part of a calibration kit comprising a number of calibration standard components. Each calibration standard component of the calibration kit can comprise means 2 for providing characteristic data of the calibration standard component in machine readable form. The characteristic data can comprise in a possible exemplary embodiment type data, a calibration standard serial number, a calibration standard gender, an identification number of the calibration standard component and/or information data about the calibration standard component behaviour. The calibration component data can for instance comprise coefficients corresponding to polynomial models or based on a sufficiently dense set of S-parameter values as a function of frequency.

The calibration standard components can form part of a manual calibration kit or an electronic calibration kit. When using a mechanical calibration kit, a calibration standard component has to be connected to the appropriate port of the measurement apparatus when requested to do so by the measurement apparatus. Typically, an engineer does connect each of the required calibration components to each port one by one and then does connect the necessary cables to realize a through connection between both ports of the measurement apparatus. In contrast to a manual calibration, an electronic or automatic calibration module requires the engineer only to connect the ports of the calibration module to the ports of the measurement apparatus. The calibration module can discover which ports are connected to which calibration planes. When using an electronic calibration module, a through connection can either be realized internally inside the calibration module or externally. When calibrating a measurement apparatus it is necessary to use identical hardware and/or software settings during both the calibration of the measurement apparatus and the measurement of the device under test DUT. Typical measurement settings options that have to remain constant include frequency settings, IF bandwidth and averages, source power and receiver step attenuator settings. Systematic measurement errors are due to imperfections in the measurement apparatus or the test setup. Systematic errors are repeatable and therefore predictable and are time-invariant. Systematic errors are characterized during the calibration process and can be removed during performing the measurements. The major systematic errors comprise errors relating to signal leakage and errors related to signal reflections. The errors relating to signal leakage comprise directivity and crosstalk. The errors related to signal reflections are source and load mismatch.

A one-port calibration can be used for reflection measurements. The one-port calibration can measure and remove systematic error terms including directivity, source match and reflection tracking. A two-port calibration usually requires twelve measurements on four known calibration standard components (short-open-low-through or SOLT). The calibration standards can be defined in a calibration kit definition file. There is a range of different methods to calibrate a VNA depending on the number of ports, the frequency range, the available calibration standard and the port type of the device under test (DUT). The measurement apparatus comprises at least one measurement port. The port type of the measurement apparatus can be coaxial, on-wafer, in-fixture or waveguide.

FIG. 4 shows a block diagram of a possible exemplary embodiment of a measurement apparatus 3 according to an aspect of the present invention. The measurement apparatus 3 comprises in the illustrated embodiment an input unit 4 adapted to input characteristic data of at least one measurement accessory device 1 according to the first aspect of the present invention. The measurement apparatus 3 further comprises a processing unit 5 adapted to process the input characteristic data of the measurement accessory device 1. The measurement accessory device 1 can form part of a calibration setup and/or a test setup. The measurement accessory device 1 can comprise a calibration component and/or a test component. The measurement apparatus 3 can be in a possible exemplary embodiment a vector network analyzer VNA comprising at least one test port for connecting a device under test DUT to the vector network analyzer VNA in a test setup.

The input unit 4 of the measurement apparatus 3 can comprise in a possible exemplary embodiment a sensor adapted to read the characteristic data from the measurement accessory device 1. The input unit 4 can be a sensor adapted to read the characteristic data from a structured surface pattern of the measurement accessory device.

In a still further possible embodiment, the input unit 4 can comprise as a sensor a capacitive touchscreen. The characteristic data encoded by a coding surface of the measurement accessory device 1 is readable by the capacitive touchscreen of the measurement apparatus 3 when pressed against the touchscreen of the measurement apparatus 3. The measurement accessory device 1 as shown in FIG. 4 can comprise a housing adapted to carry encoded characteristic data of the measurement accessory device 1. In a possible implementation, the housing of the measurement accessory device 1 comprises at least one coding surface having a structured pattern consisting of protrusions and/or recesses providing the encoded characteristic data of the measurement accessory device 1. The characteristic data encoded by the coding surface of the measurement accessory device 1 is readable in a possible embodiment of the measurement apparatus 3 by a capacitive touchscreen forming the input unit 4 of the measurement apparatus 3 when the housing of the measurement accessory device 1 is pressed against the touchscreen of the measurement apparatus 3. In a possible embodiment, the coding surface of the measurement accessory device 1 can comprise braille characters having raised dots representing the characteristic data of the measurement accessory device 1. The braille characters can be formed by small rectangular blocks that contain tiny palpable bumps or dots. The number and arrangement of these raised dots distinguish one character from another character. In a possible embodiment, the measurement apparatus 3 comprises a memory for storing firmware of the measurement apparatus 3. If the calibration requires a specific calibration standard element or a calibration standard component to be connected to a port of the measurement apparatus 3, it can be tested in a possible embodiment whether the respective calibration standard component is indeed the expected correct calibration standard component. In a possible implementation, the necessary characteristic data can be transferred from the measurement accessory device 1 or calibration component to the measurement apparatus 3. The characteristic data can comprise in a possible implementation data coefficients, electrical lengths, or other information data of the respective calibration standard component. The characteristic data can also detect drift effects or calibration deviations caused by consumption.

Figure 5:
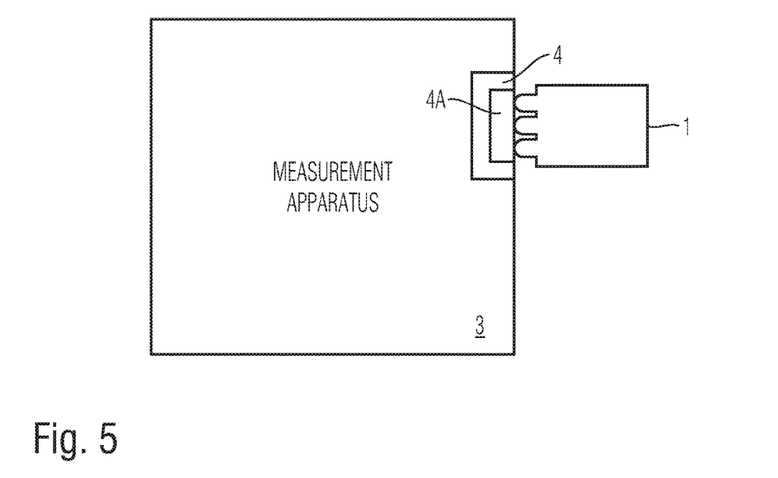
FIG. 5 shows schematically a possible exemplary embodiment of a measurement apparatus according to the second aspect of the present invention.

FIG. 5 shows schematically a possible exemplary embodiment of a measurement apparatus 3 according to an aspect of the present invention. The measurement apparatus 3 comprises in the illustrated embodiment an input unit 4 having a capacitive touchscreen 4A to which a housing of a measurement accessory device 1 can be pressed. In the illustrated embodiment, the housing of the measurement accessory device 1 comprises a coding surface having a structured pattern consisting of protrusions and/or recesses providing the encoded characteristic data of the respective measurement accessory device 1. The measurement accessory device 1 as shown in FIG. 5 can be for instance a calibration standard component. For setting up the calibration arrangement, the measurement apparatus 3 can request the engineer to identify the necessary measurement accessory device 1 by pressing the coding surface of the measurement accessory device 1 against the capacitive touchscreen 4A of the input unit 4 of the measurement apparatus 3. The encoded characteristic data can comprise a type data indicating a type of the respective measurement accessory device 1 and an identifier of the respective measurement accessory device 1. The measurement accessory device 1 as shown in FIG. 5 can be a calibration component and/or a test component. If the measurement accessory device 1 is a calibration component, the characteristic data can comprise a calibration standard serial number of the calibration standard component, a calibration standard gender of the calibration standard component, an identification number of the calibration standard component and/or information data about the expected behaviour of the calibration standard component 1. In a possible embodiment, the engineer can press one measurement accessory device 1 after the another against the capacitive touchscreen 4A of the measurement apparatus 3 in response to a series of requests output via the graphical user interface of the measurement apparatus 3 to the test engineer. The measurement accessory device 1 provides the characteristic data of the measurement accessory device 1 in machine readable form to the measurement apparatus 3. The characteristic data can then be used by the measurement apparatus 3 during measurement of a device under test (DUT) such as an electronic circuit. No separate data carrier is necessary to provide the measurement apparatus 3 with the characteristic data of the respective measurement accessory device 1 as can be seen in FIG. 5.

Figure 6:
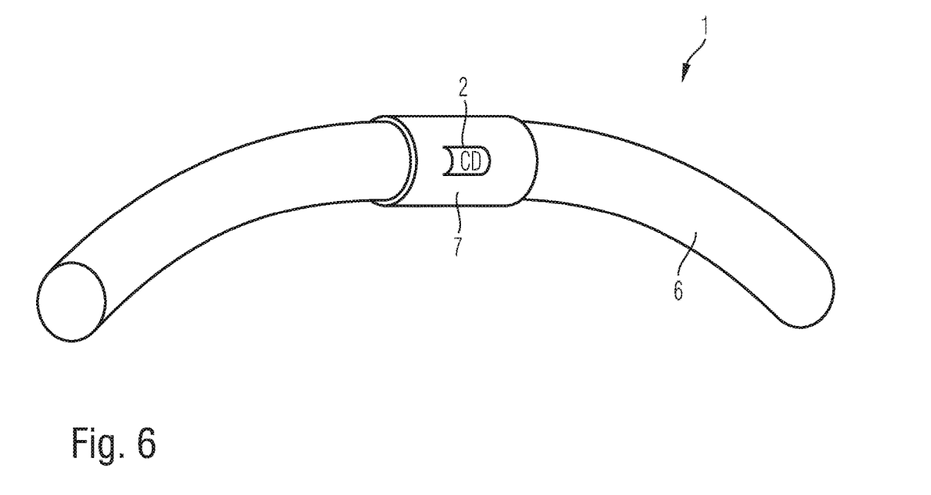
FIG. 6 shows schematically a possible exemplary embodiment of a measurement accessory device according to the first aspect of the present invention.

FIG. 6 shows an exemplary embodiment of a measurement accessory device 1 according to the first aspect of the present invention. In the illustrated embodiment, the measurement accessory device 1 is formed by a cable 6 such as a coax cable which can be used in a test arrangement. In the illustrated embodiment, the cable 6 which can comprise a high frequency cable comprises a heat shrink tube 7 attached to the cable as shown in FIG. 6. The heat shrink tube 7 comprises in the illustrated embodiment means 2 for providing characteristic data of the cable 6 in machine readable form which can be used by a measurement apparatus 3 during measurement of a device under test DUT. In a possible embodiment, a visible code can be printed on the heat shrink tube 7 of the cable 6. The visible code can be detected in a possible implementation by an optical sensor of the measurement apparatus 3. The heat shrink tube 7 can also carry braille characters.

In a possible embodiment, the measurement apparatus 3 as illustrated in FIG. 4 comprises an input unit 4 having an optical sensor adapted to sense characteristic data provided on the surface of the housing of a measurement accessory device 1. In a possible embodiment, the optical sensor of the input unit 4 of the measurement apparatus 3 can be adapted to read a one-dimensional or two-dimensional bar code of a measurement accessory device 1. In a possible embodiment, the optical sensor can also be adapted to sense characteristic data engraved in a structured surface pattern of a housing of the measurement accessory device 1.

In a further possible embodiment, the input unit 4 of the measurement apparatus 1 can also comprise a sensor adapted to receive characteristic data from an acoustic bar code carried by the measurement accessory device 1. A visible data matrix code can be provided on the surface of the measurement accessory device 1. Further, a visible data matrix code carrying characteristic data of the measurement accessory device 1 can also be printed on a sticker attached to a housing of the measurement accessory device 1. In a still further possible implementation, the measurement accessory device 1 can also comprise an integrated RFID tag adapted to store characteristic data of the measurement accessory device 1 and readable by a transceiver of the input unit 4 of the measurement apparatus 3. In a further implementation, the measurement accessory device 1 can store the characteristic data in redundant form by using one or several means 2 for providing characteristic data, i.e. a coding surface of the housing and/or a printed code.

Figure 7:
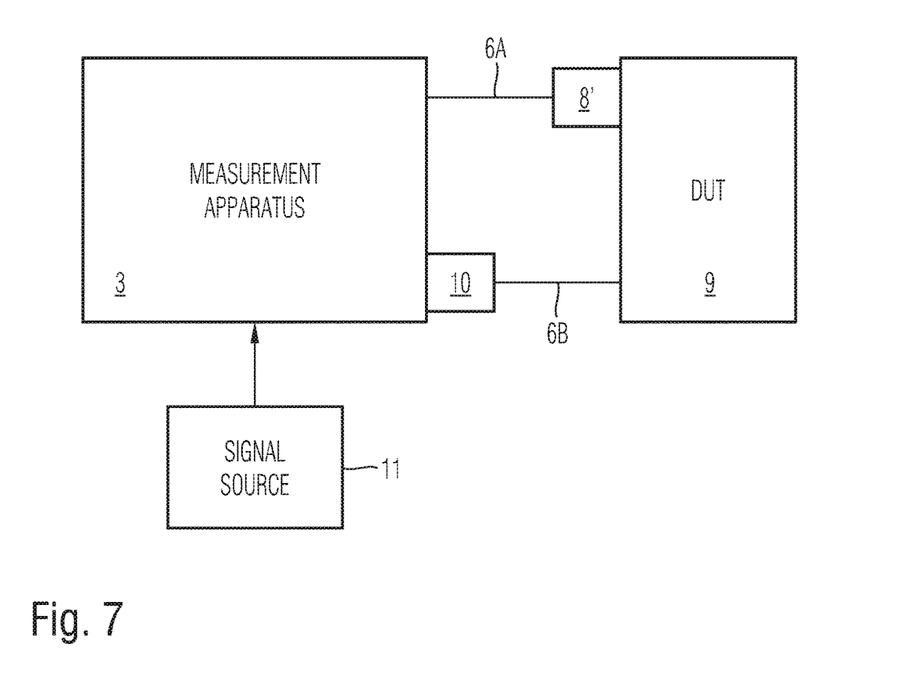
FIG. 7 shows schematically a possible test setup using measurement accessory devices according to the first aspect of the present invention.

FIG. 7 illustrates an exemplary test arrangement using measurement accessory devices 1 according to the first aspect of the present invention. In the illustrated embodiment, a measurement apparatus 3 is formed by a vector network analyzer VNA. In the illustrated test setup, the measurement apparatus 3 comprises a test port to connect a device under test DUT to the measurement apparatus 3. In the example shown in FIG. 7, the device under test DUT 9 is connected to the measurement apparatus 3 via a first cable 6A and a second cable 6B. Between the first cable 6A and the device under test, an adapter 8 is provided forming a measurement accessory device 1. The adapter device 8 can for instance be a mechanical adapter allowing to connect the cable 6A to a channel of the device under test 9. Further, an attenuation device 10 is connected between the second cable 6B and the test port of the measurement apparatus 3. In the illustrated test setup, the measurement apparatus 3 is further connected to a signal source 11 applying a noise signal to the measurement apparatus 3. The cables 6A, 6B, the adapter device 7, the attenuation device 10 and the signal source 11 all form measurement accessory devices 1 of the illustrated test setup. Each measurement accessory device 1 of the test setup comprises means 2 for providing characteristic data of the respective measurement accessory device 1 in machine readable form. When arranging the test setup the test engineer or user can sequentially transfer the characteristic data of the measurement accessory devices 1 for further processing into the measurement apparatus 3. In a possible embodiment, the processing unit 5 of the measurement apparatus 3 is adapted to process characteristic data of different measurement accessory devices 1 used in the test setup to check automatically whether the different measurement accessory devices 1 are compatible to each other and suited to achieve a test objective of the test setup. In the illustrated example of FIG. 7, a processing unit 5 of the measurement apparatus 3 can process the characteristic data of the two cables 6A, 6B, the adapter device 8, the attenuation device 10 and of the signal source 11 to check whether these measurement accessory devices 1 are compatible to each other and suited to achieve the test objective. In the illustrated example, the processing unit 5 of the measurement apparatus 3 can for instance determine that the attenuation device 10 is not compatible with the cable 6B. Further, the processing unit 5 can calculate on the basis of the characteristic data in the given example that the adapter device 8 does not fit to cable 6A or vice versa.

Figure 8:
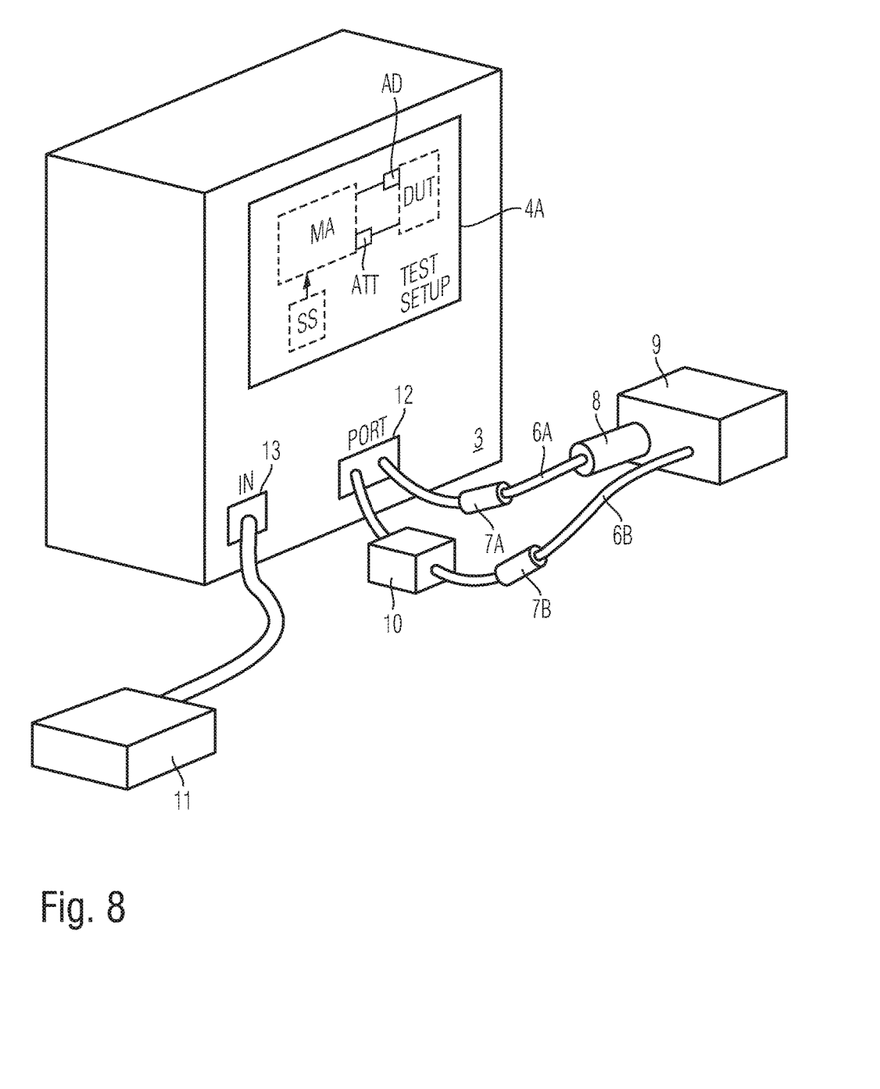
FIG. 8 shows a perspective view on a test arrangement using measurement accessory devices according to the first aspect of the present invention.

FIG. 8 shows a perspective view on a test arrangement using measurement accessory devices 1 according to the first aspect of the present invention. In the illustrated example, a display unit 4A of the measurement apparatus 3 comprises a capacitive touchscreen adapted to display a possible setup for testing a device under test DUT 9. The test setup is displayed on the capacitive touchscreen 4A to the test engineer and user which arranges the accessory devices 1 according to the displayed test setup to implement the test setup. In the illustrated embodiment, the capacitive touchscreen 4A forms the input unit 4 of the measurement apparatus 3 and is adapted to input characteristic data of different measurement accessory devices 1 of the test setup. In the illustrated example, the measurement accessory devices 1 comprise a first cable 6A having a heat shrink tube 7A, a second cable 6B comprising a heat shrink tube 7B, an adapter device 8 as well as a signal attenuator 10 and a signal source apparatus 11. In the illustrated embodiment, the measurement apparatus 3 comprises a test port 12 and a port for connecting the signal source device 11. When arranging the measurement accessory devices 1 according to the displayed test setup arrangement shown on the touchscreen 4A, the test engineer can in a possible embodiment press the housing of the respective measurement accessory device 1 on the touchscreen 4A so that the input unit 4 can read out the characteristic data from the respective measurement accessory device 1. In a possible embodiment, the touchscreen 4A comprises different sensitive areas according to the displayed test setup. The measurement apparatus 3 can also give instructions to the test engineer to supply the characteristic data of the different measurement accessory devices 1 one after the other. For instance, the test engineer can be requested to provide first the characteristic data of the necessary cables 6A, 6B. The cables 6A, 6B displayed on the touchscreen 4A can be highlighted to the test engineer, for instance by blinking or a specific display colour. Then, the test engineer can press the respective heat shrink tube 7A, 7B of the physical cable 6A, 6B to the cable symbol displayed on the touchscreen 4A of the measurement apparatus 3 for transferring the characteristic data of the respective cable to the processing unit 5 of the measurement apparatus 3. After having transferred the characteristic data of the two physical cables 6A, 6B, the test engineer can press the housing of the adapter 8 to the adapter symbol AD displayed on the touchscreen 4A of the measurement apparatus 3 for transferring the characteristic data of the adapter 8 to the processing unit 5 of the measurement apparatus 3. In the next step, the test engineer can press the housing of the attenuator device 10 onto the attenuator symbol ATT displayed on the touchscreen 4A of the measurement apparatus 3 to transfer also the characteristic data of the attenuator device 10 to the processing unit 5 of the measurement apparatus 3. Finally, the test engineer can press a surface of the housing of the signal source 11 carrying its characteristic data to the corresponding symbol SS of the signal source 11 displayed on the touchscreen 4A of the measurement apparatus 3 to transfer the characteristic data of the signal source 11 to the processing unit 5 of the measurement apparatus 3. In the given example, the test arrangement comprises five measurement accessory devices 1, i.e. the two cables 6A, 6B, the adapter device 8, the attenuator device 10 and the signal source 11. After having received the characteristic data of all five measurement accessory devices 1, the processing unit 5 can process the characteristic data and check automatically whether the measurement accessory devices 1 are compatible to each other and/or suited to achieve a predetermined test objective of the displayed test setup. The result of the compatibility check can be displayed to the test engineer, for instance, the test engineer can be advised to use a different attenuation device 10 providing a higher signal attenuation when using the signal source 11.

The measurement apparatus 3 can in a further embodiment also display a calibration setup with calibration components as measurement accessory devices 1. In this embodiment, the test engineer can press the necessary calibration standard components one after the other on the respective displayed areas of the calibration setup to copy the characteristic data of the calibration standard components into the measurement apparatus 3. In this embodiment, the measurement apparatus 3 can check automatically whether the calibration standard components are compatible to each other and/or are suited to achieve the respective calibration objective of the calibration setup.

By using the measurement accessory devices 1 according to the first aspect of the present invention, it becomes much easier to arrange a test and/or calibration setup. Further, no separate data carriers must be used for providing the measurement apparatus 3 with the characteristic data of the different measurement accessory devices 1. A confusion of different data carriers storing the characteristic data of different measurement accessory devices 1 is avoided. Consequently, a possible error source when performing the measurement is eliminated. Further, the measurement apparatus can perform automatically routines to check whether the used measurement accessory devices 1 are compatible to each other and achieve the calibration objective and/or test objective. This facilitates the calibration and/or test process significantly. The measurement apparatus 3 can be in a possible embodiment a vector network analyzer. Further, the measurement apparatus 3 can also be an oscilloscope, a signal analyzer, a network analyzer or any other kind of testing device using measurement accessory devices 1.

What is claimed is:

1. A measurement apparatus comprising:
a capacitive touchscreen adapted to input characteristic data of measurement accessory devices pressed against the capacitive touchscreen, wherein each measurement accessory device comprises means for providing characteristic data of said measurement accessory device in machine readable form used during measurement of a device under test (DUT) by said measurement apparatus, and
a processing unit adapted to process the input characteristic data of the measurement accessory devices, wherein the capacitive touchscreen of said measurement apparatus is capable of displaying a test setup for testing the DUT to a user and comprises different sensitive areas according to the displayed test setup on which the measurement accessory devices of the displayed test setup can be pressed by the user to read from these measurement accessory devices the characteristic data transferred to the processing unit of said measurement apparatus.

2. The measurement apparatus of claim 1, wherein a housing of said measurement accessory device comprises at least one coding surface having a structured pattern consisting of protrusions or recesses providing encoded characteristic data of said measurement accessory device.

3. The measurement apparatus of claim 2, wherein the coding surface of the measurement accessory device pressed against the capacitive touchscreen of the measurement apparatus comprises braille characters comprising raised dots representing the characteristic data of the respective measurement accessory device.

4. The measurement apparatus of claim 2, wherein said coding surface comprises at least one of:
an acoustic bar code; or
an engraved data matrix code.

5. The measurement apparatus of claim 1, wherein said measurement accessory device pressed against the capacitive touchscreen of the measurement apparatus comprises a calibration component or a calibration module used to calibrate said measurement apparatus.

6. The measurement apparatus of claim 5, wherein the characteristic data of said calibration component comprises at least one of:
type data,
a calibration standard serial number,
a calibration standard gender,
an identification number of said calibration component,
information data about the calibration component behaviour.

7. The measurement apparatus of claim 1, wherein said measurement accessory device pressed against the capacitive touchscreen of the measurement apparatus comprises a test component used in a test setup to perform measurements of said device under test (DUT) by said measurement apparatus.

8. The measurement apparatus of claim 7, wherein the test component comprises at least one of:
an adapter,
a cable,
a probe,
an attenuator,
a frequency converter,
an impedance converter,
a signal source.

9. The measurement apparatus of claim 1, wherein the characteristics data read from the measurement accessory devices is stored in a data memory of the measurement apparatus for further processing by the processing unit of said measurement apparatus.

10. The measurement apparatus of claim 1, wherein said processing unit is adapted to process characteristic data of different measurement accessory devices used during calibration of said measurement apparatus to check automatically whether the measurement accessory devices are compatible to each other and suited to achieve a test objective of the test setup displayed on the capacitive touchscreen.

11. The measurement apparatus of claim 1, wherein the measurement apparatus is a vector network analyzer, VNA, comprising at least one test port for connecting a device under test (DUT) to said vector network analyzer, VNA, in a test setup.

12. The measurement apparatus of claim 1, wherein the processing unit of the measurement apparatus is adapted to process the transferred characteristic data to check automatically whether the measurement accessory devices are compatible to each other and suited to achieve a predetermined test objective of the displayed test setup.

13. The measurement apparatus according to claim 1, wherein the measurement apparatus is adapted to give instructions to the user to supply characteristic data of different measurement accessory devices by pressing the respective measurement accessory devices one after the other on the corresponding symbol displayed on the capacitive touchscreen.

14. The measurement apparatus of claim 1, wherein the capacitive touchscreen is adapted to read the characteristic data from a structured surface pattern of the measurement accessory device pressed against the capacitive touchscreen.

15. A test arrangement comprising:
at least one measurement apparatus comprising a capacitive touchscreen adapted to input characteristic data of measurement accessory devices pressed against the capacitive touchscreen and a processing unit adapted to process the input characteristic data of said measurement accessory devices and comprising measurement accessory devices connectable to the measurement apparatus or to a device under test (DUT) of said test setup, wherein each measurement accessory device comprises means for providing its characteristic data in machine readable form used during measurement of said device under test (DUT) by said measurement apparatus, wherein the capacitive touchscreen of said measurement apparatus is capable of displaying a test setup for testing the device under device, DUT, to a user and comprises different sensitive areas ac-cording to the displayed test setup on which the measurement accessory devices of the displayed test setup can be pressed by the user to read from these measurement accessory devices the characteristic data transferred to the processing unit of said measurement apparatus.

16. The test arrangement of claim 15, wherein the processing unit of the measurement apparatus is adapted to process the transferred characteristic data to check automatically whether the measurement accessory devices are compatible to each other and suited to achieve a predetermined test objective of the displayed test setup.

* * * * *